(12) United States Patent
Moctezuma

(10) Patent No.: US 11,018,670 B2
(45) Date of Patent: May 25, 2021

(54) OUTPUT BUFFER CIRCUIT

(71) Applicant: TEXAS INSTRUMENTS INCORPORATED, Dallas, TX (US)

(72) Inventor: Ariel Dario Moctezuma, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/773,273

(22) Filed: Jan. 27, 2020

(65) Prior Publication Data

US 2020/0244267 A1 Jul. 30, 2020

Related U.S. Application Data

(60) Provisional application No. 62/797,812, filed on Jan. 28, 2019.

(51) Int. Cl.
*H03K 19/09* (2006.01)
*H03K 19/00* (2006.01)

(52) U.S. Cl.
CPC ......... *H03K 19/09* (2013.01); *H03K 19/0005* (2013.01)

(58) Field of Classification Search
CPC ............... H03K 19/09; H03K 19/0005; H03K 19/00315; H03K 19/00361
See application file for complete search history.

(56) References Cited

U.S. PATENT DOCUMENTS

| | | | | |
|---|---|---|---|---|
| 6,031,412 A | * | 2/2000 | Genova | H03K 17/063 327/534 |
| 6,075,391 A | * | 6/2000 | Tarantola | H03K 17/063 327/111 |
| 6,538,464 B2 | | 3/2003 | Muljono et al. | |
| 7,382,674 B2 | | 6/2008 | Hirabayashi | |
| 8,890,603 B2 | | 11/2014 | Mitsuda et al. | |
| 2007/0018684 A1 | | 1/2007 | Pan et al. | |
| 2013/0044838 A1 | * | 2/2013 | Ding | H03B 5/1228 375/340 |

FOREIGN PATENT DOCUMENTS

JP 0010084272 A 3/1998

OTHER PUBLICATIONS

PCT Search Report for Application No. PCT/US 2020/015338, dated May 14, 2020.

* cited by examiner

*Primary Examiner* — Daniel D Chang
(74) *Attorney, Agent, or Firm* — Mark Allen Valetti; Charles A. Brill; Frank D. Cimino

(57) ABSTRACT

An output buffer circuit includes an output terminal, a transistor, and a resistor. The transistor includes a first terminal coupled to the output terminal, a second terminal coupled to a ground rail, and a third terminal coupled to an output signal source. The resistor includes a first terminal coupled to a fourth terminal of the transistor, and a second terminal coupled to the ground rail.

19 Claims, 4 Drawing Sheets

OUTPUT BUFFER CIRCUIT

CROSS-REFERENCE TO RELATED APPLICATIONS

The present application claims priority to U.S. Provisional Patent Application No. 62/797,812, filed Jan. 28, 2019, entitled "Output Buffer Design for RF Harmonic Distortion Sensitive Systems," which is hereby incorporated herein by reference in its entirety.

BACKGROUND

In an electronic device, radio frequency energy coupled to an input or output terminal of an integrated circuit produces harmonic distortion that is reflected back onto the conductor coupled to the terminal. The reflected harmonic distortion may interfere with the operation of other circuits or devices in the vicinity of the integrated circuit.

SUMMARY

An output buffer circuit that reflected harmonic distortion is described herein. In one example, an output buffer circuit includes an output terminal, a transistor, and a resistor. The transistor includes a first terminal coupled to the output terminal, a second terminal coupled to a ground rail, and a third terminal coupled to an output signal source. The resistor includes a first terminal coupled to a fourth terminal of the transistor, and a second terminal coupled to the ground rail.

In another example, an output buffer circuit includes an output terminal, a transistor, and a resistor. The transistor includes a drain terminal coupled to the output terminal, a source terminal coupled to a ground rail, and a backgate terminal coupled to a ground via a resistor. The resistor is configured to decouple the backgate terminal from the ground rail at frequencies higher than a selected frequency.

An integrated circuit includes an output buffer circuit configured to reduce reflections. The output buffer circuit includes an output terminal, a first transistor, a first resistor, a second transistor, a second resistor, and a third transistor. The first transistor includes a first terminal coupled to the output terminal, a second terminal coupled to a ground rail, and a third terminal coupled to an output signal source. The first resistor includes a first terminal coupled to a fourth terminal of the first transistor, and a second terminal coupled to the ground rail. The second transistor includes a first terminal coupled to the fourth terminal of the first transistor, a second terminal coupled to the ground rail, and a third terminal coupled to the ground rail. The second resistor includes a first terminal coupled to the third terminal of the first transistor. The third transistor includes a first terminal coupled to a second terminal of the second resistor, and a second terminal coupled to the ground rail.

BRIEF DESCRIPTION OF THE DRAWINGS

For a detailed description of various examples, reference will now be made to the accompanying drawings in which.

DETAILED DESCRIPTION

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

Some output buffer circuit implementations produce about −30 decibels, relative to the carrier (dBc), of harmonic distortion. The distortion is primarily produced by drain-backgate nonlinear capacitance and backgate-drain forward bias diode of the buffer circuit output transistor. The drain-backgate capacitance is highly nonlinear and causes substantial second harmonic distortion. The impedance of the diode quickly decreases when input terminal voltage is less than about 300 mV. The diode clips an incoming radio frequency (RF) signal, causing substantial distortion. One technique for reducing the nonlinear effects involves adding a voltage-independent capacitor at the output terminal of the buffer circuit to reduce the voltage magnitude of the RF interference while keeping the pin impedance linear. However, high density voltage insensitive capacitors often require additional masks and low-density voltage insensitive capacitors increase die area and cost.

The output buffer circuits described herein reduce the nonlinear effects of the output transistor by decoupling the backgate terminal of the output transistor from ground at RF frequencies. With the backgate decoupled from ground, most alternating current (AC) flows in a drain-backgate-gate-ground path. Some implementations limit current flow to ground through the backgate to gate capacitance of the output transistor by inserting a resistor between the gate terminal of the drain terminal of control transistor coupled to the gate terminal. With addition of the resistor, most of the AC current flows through the drain-backgate-source path through the diode capacitances. Because, the diodes are configured in a back to back fashion, the series capacitance becomes linear, since one diode compensates the nonlinear effects of the other diode. The output buffer circuits described herein may provide harmonic distortion of about −60 dBc or less when powered or unpowered.

Figure 1:
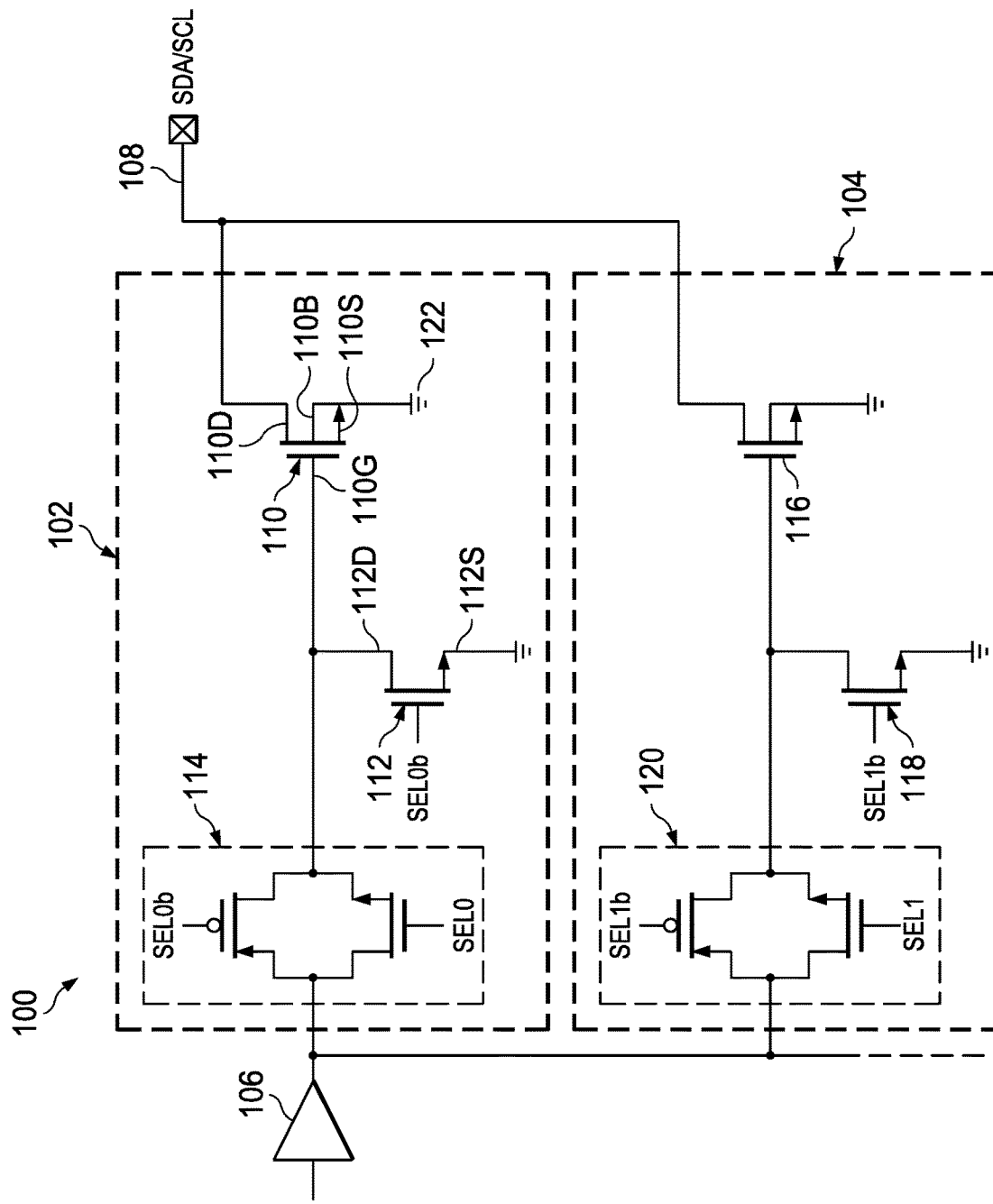
FIG. 1 shows an example output circuit with configurable drive strength.

FIG. 1 shows an example output circuit 100 with configurable drive strength. The output circuit 100 includes a drive circuit 102, a drive circuit 104, an output signal source 106, and an output terminal 108. The output signal source 106 provides a signal to be output to the drive circuit 102 and the drive circuit 104. The drive circuit 102 and the drive circuit 104 are coupled to the output signal source 106 for reception of a signal to be output. The drive circuit 102 and the drive circuit 104 are coupled to and provide an output signal to the output terminal 108. While the output circuit 100 is illustrated as include two drive circuits (the drive circuit 102 and the drive circuit 104), in practice the output circuit 100 may include more than two drive circuits. Implementations of the output circuit 100 may enable a different number of drive circuits to provide different drive currents at the output terminal 108. For example, an implementation of the output circuit 100 providing a relatively low drive current may enable the drive circuit 102 and disable the drive circuit 104, which an implementation of the output circuit 100 providing a higher drive current may enable both the drive circuit 102 and the drive circuit 104.

The drive circuit 102 includes an output transistor 110, a control transistor 112, and a switch 114. The output transistor 110 is coupled to the output terminal 108 for pulling down the output terminal 108. The output transistor 110 includes a drain terminal 110D coupled to the output terminal 108, a source terminal 110S and a backgate terminal 110G coupled to a ground rail 122, and a gate terminal 110G coupled to the control transistor 112 and the switch 114. The output transistor 110 and the control transistor 112 are N-channel metal oxide semiconductor field effect transistors (MOSFETs) in some implementations of the drive circuit 102.

The control transistor 112 enables or disable operation of the output transistor 110. The control transistor 112 includes a drain terminal 112D coupled the gate terminal 110G of the output transistor 110, and source terminal 112S coupled to the ground rail 122.

The switch 114 enables or disable flow of signal to be output from the output signal source 106 to the output transistor 110.

The drive circuit 104 is similar to, or identical to, the drive circuit 102, and includes an output transistor 116, a control transistor 118, and a switch 120. The output transistor 116, the control transistor 118, and the switch 120 respectively correspond to the output transistor 110, the control transistor 112, and the switch 114 and operate as explained with respect to the drive circuit 102.

Figure 2:
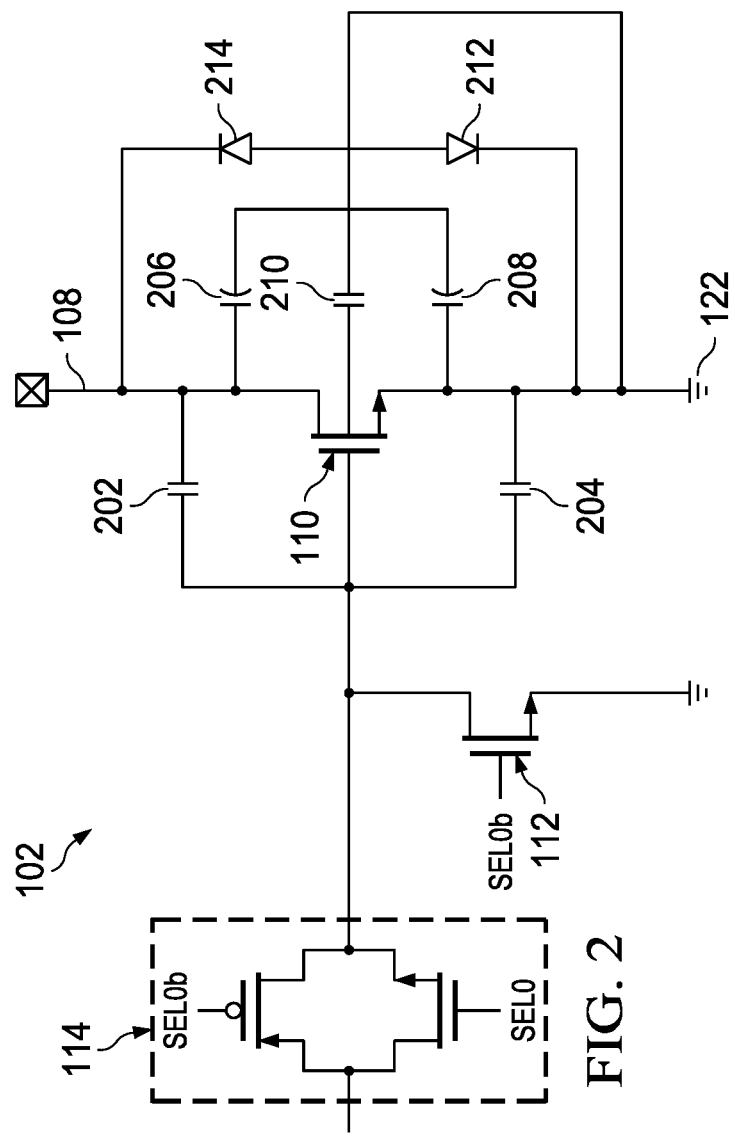
FIG. 2 shows parasitic elements of the output transistor of an output buffer circuit.

FIG. 2 shows example parasitic elements of the output transistor 110 of the drive circuit 102. The output transistor 110 includes drain-gate capacitance 202, drain-backgate capacitance 206, gate-source capacitance 204, backgate-source capacitor 208, backgate-gate capacitance 210, backgate-source diode 212, and backgate-drain diode 214. The drain-backgate capacitance 206 is nonlinear and causes substantial distortion. The backgate-drain diode 214 acts like a short circuit when voltage at the output terminal 108 is less than about 300 millivolts, which clips RF signal received at the output terminal 108 causing substantial distortion.

Figure 3:
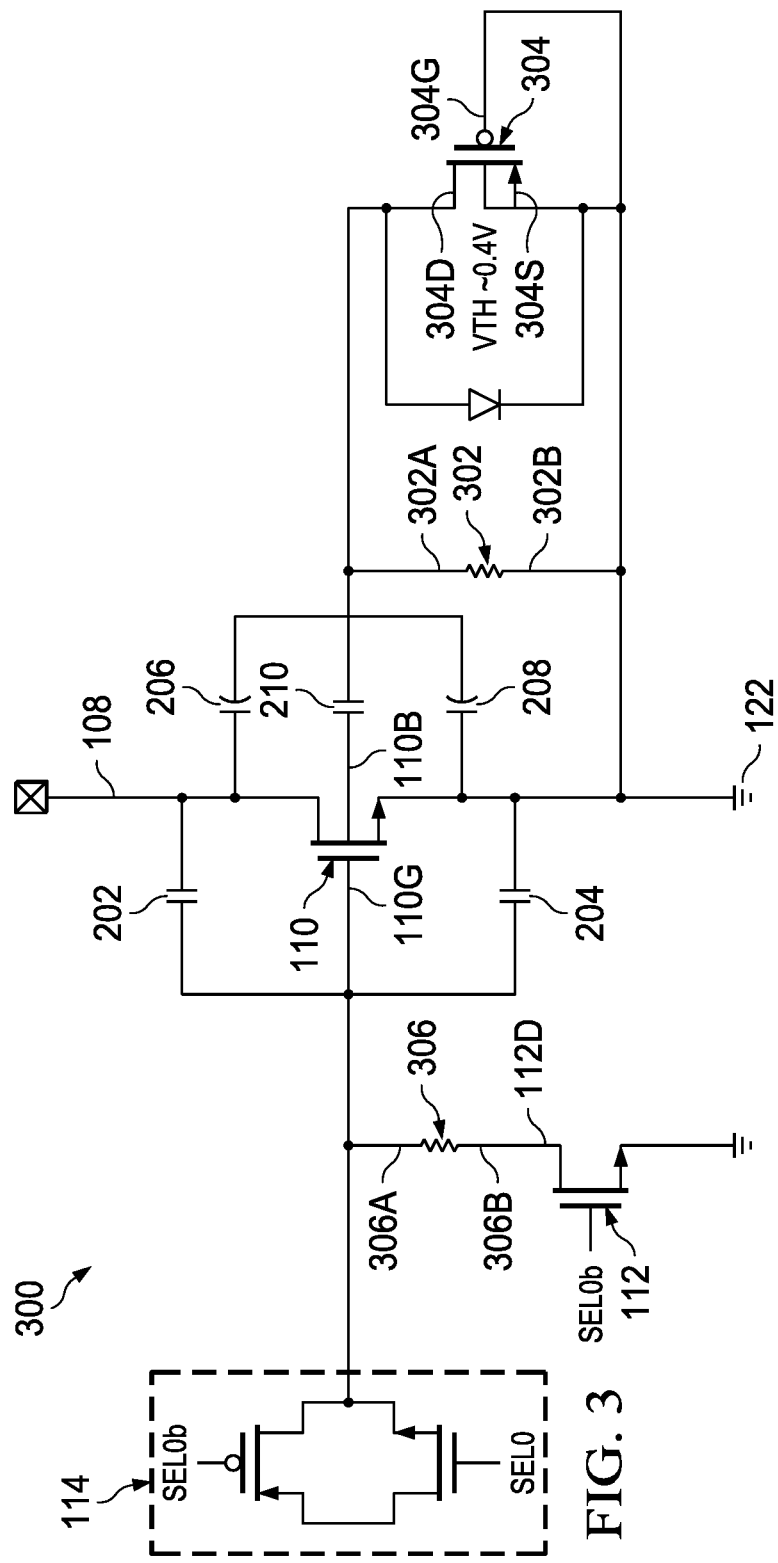
FIG. 3 shows an example output buffer circuit that decouples the backgate of the output transistor from ground for radio frequency signals.

FIG. 3 shows an example output buffer circuit 300 that decouples the backgate of the output transistor from ground for radio frequency signals. The output buffer circuit 300 includes the output terminal 108, the output transistor 110, the control transistor 112, the switch 114, a resistor 302, a transistor 304, and a resistor 306. In the output buffer circuit 300, to mitigate the drain-backgate capacitance 206 and conduction of the backgate-drain diode 214 (see FIG. 2), the resistor 302 decouples the backgate terminal 110G from the ground rail 122. The resistor 302 includes a terminal 302A coupled to the backgate terminal 110G of the output transistor 110 and a terminal 302B coupled to the ground rail 122. The resistor 302 limits current flow from the backgate terminal 110G to the ground rail 122. The resistance of the resistor 302 is selected such that at RF frequencies the backgate terminal 110G is not coupled to the control transistor 112, and such that at frequencies of operational signal at the output terminal 108 (e.g., I²C SDA/SCL frequencies) the backgate terminal 110G does not deviate from ground and cause the backgate-source diode 212 (see FIG. 2) to turn on. In some implementations of the output buffer circuit 300, the resistor 302 has a value of approximately 1 kiloohm (K) (e.g. 1K+/−10%).

The transistor 304 is a connected in parallel with the resistor 302. The transistor 304 is a clamp transistor configured to clamp the backgate terminal 110G to the ground rail 122. If the backgate terminal 110G rises above ground by more than about 0.4V, the resistor 302, rather than the backgate-source diode 212, passes the current, which prevents a bipolar transistor formed in the output transistor 110 from turning on. The transistor 304 may be P-channel MOSFET with a threshold of about 400 millivolts in some implementations of the output buffer circuit 300. The transistor 304 includes a drain terminal 304D coupled to the terminal 302A of the resistor 302, and a source terminal 304S and gate terminal 304G coupled to the terminal 302B of the resistor 302.

With the backgate terminal 110G isolated from the ground rail 122 by the resistor 302, most AC current flows through the drain-backgate capacitance 206 and the backgate-gate capacitance 210 to ground when the control transistor 112 is ON. To reduce current flow in this path, the resistor 306 is inserted between the output transistor 110 and the control transistor 112. The resistor 306 includes a terminal 306A coupled to the gate terminal 110G of the output transistor 110 and a terminal 306B coupled to the drain terminal 112D of the control transistor 112. The resistor 306 may have resistance of about 10 kiloohms in some implementations of the output buffer circuit 300.

With the resistor 302 and the resistor 306 in place, most of the AC current will flow through the drain-backgate-source path through the capacitances of the backgate-source diode 212 and the backgate-drain diode 214. The backgate-source diode 212 and the backgate-drain diode 214 are coupled anode-to-anode, which causes the series capacitance of the diodes to become linear, since one diode compensates the nonlinear effects of the other diode and makes the series capacitance more constant than the capacitance of a single diode.

Figure 4:
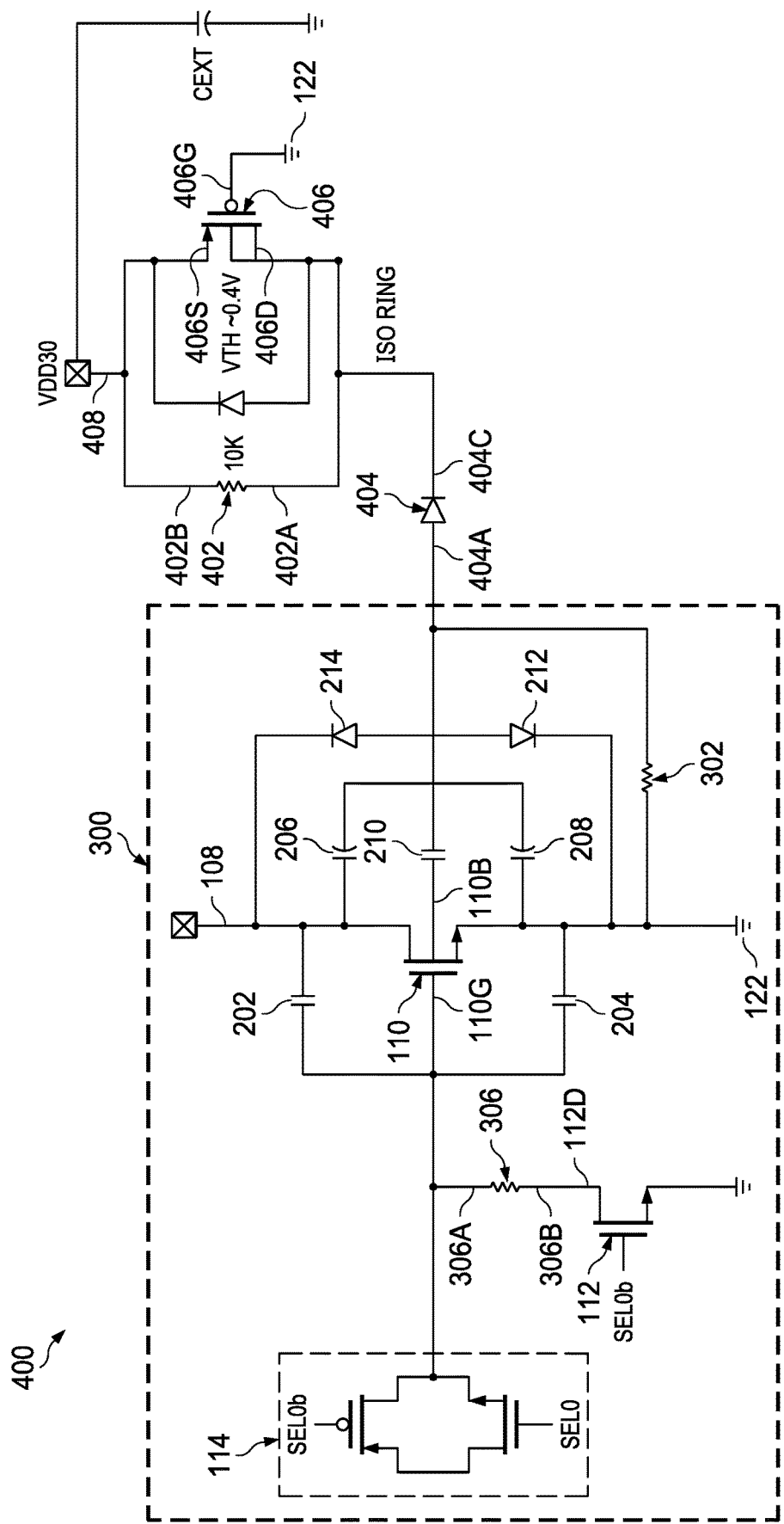
FIG. 4 shows an example output buffer circuit that decouples the isolation ring of from the power supply rail.

FIG. 4 shows an example output buffer circuit 400 that decouples the isolation ring of from the power supply rail. The output buffer circuit 400 includes the output buffer circuit 300, a diode 404, a resistor 402, and a transistor 406. In the output buffer circuit 300, the isolation of the output transistor 110 generates distortion due to its nonlinear capacitance. To mitigate these nonlinear effects when the output buffer circuit 400 is OFF (e.g., VDD30=0V), the output buffer circuit 400 connects the isolation ring to the power supply rail 408 via the resistor 402. This arrangement creates a zero at RF frequencies and effectively disconnects the isolation from the unpowered low impedance power supply rail 408.

The diode 404 includes an anode terminal 404A coupled to the backgate terminal 110G of the output transistor 110 and a cathode terminal 404C coupled to a terminal 402A of the resistor 402. A terminal 402B of the resistor 402 is coupled to the power supply rail 408. The resistor 402 has a resistance of about 10 kiloohms in some implementations of the output buffer circuit 400.

The transistor 406 is connected in parallel with the resistor 402. When power supply voltage is provided at the power supply rail 408, the transistor 406 connects the power supply rail 408 to the isolation ring. The transistor 406 reduces isolation capacitance by reverse biasing the isolation diode ring and provides a low impedance path from the power supply rail 408 to the isolation ring. The transistor 406 includes a source terminal 406S coupled to the terminal 402B of the resistor 402, a gate terminal 406G coupled to the ground rail 122, and a drain terminal 406D coupled to the terminal 402A of the resistor 402. The transistor 406 is a P-channel MOSFET is some implementations of the output buffer circuit 400.

Modifications are possible in the described embodiments, and other embodiments are possible, within the scope of the claims.

What is claimed is:

1. An output buffer circuit, comprising:
   an output terminal;
   a transistor comprising:
     a first terminal coupled to the output terminal;
     a second terminal directly connected to a ground rail; and
     a third terminal coupled to an output signal source;
   a resistor comprising:
     a first terminal coupled to a fourth terminal of the transistor; and
     a second terminal connected to the ground rail.

2. The output buffer circuit of claim 1, wherein:
   the transistor is a first transistor; and
   the output buffer circuit comprises:
     a second transistor comprising:
       a first terminal coupled to the fourth terminal of the first transistor;
       a second terminal coupled to the ground rail; and
       a third terminal coupled to the ground rail.

3. The output buffer circuit of claim 2, wherein the fourth terminal of the first transistor is a backgate terminal, and the second transistor is configured to clamp the backgate terminal to the ground rail.

4. The output buffer circuit of claim 1, wherein:
   the transistor is a first transistor;
   the resistor is a first resistor; and
   the output buffer circuit comprises:
     a second resistor comprising a first terminal coupled to the third terminal of the first transistor; and
     a second transistor comprising:
       a first terminal coupled to a second terminal of the second resistor; and
       a second terminal coupled to the ground rail.

5. The output buffer circuit of claim 4, wherein the resistor is configured to limit current flow from the fourth terminal to the second transistor.

6. The output buffer circuit of claim 1, wherein the fourth terminal of the transistor is a backgate terminal, and the resistor is configured to decouple the backgate terminal from the ground rail.

7. An output buffer circuit, comprising:
   an output terminal;
   a transistor comprising:
     a first terminal coupled to the output terminal;
     a second terminal coupled to a ground rail; and
     a third terminal coupled to an output signal source;
   a first resistor comprising:
     a first terminal coupled to a fourth terminal of the transistor; and
     a second terminal coupled to the ground rail;
   a second resistor comprising a first terminal coupled to a power supply rail; and
   a diode comprising:
     an anode terminal coupled to the fourth terminal of the transistor; and
     a cathode terminal coupled to a second terminal of the second resistor.

8. The output buffer circuit of claim 7, wherein:
   the transistor is a first transistor; and
   the output buffer circuit further comprises:
     a second transistor comprising:
       a first terminal coupled to the power supply rail;
       a second terminal coupled to the ground rail; and
       a third terminal coupled to the cathode terminal of the diode.

9. An output buffer circuit, comprising:
   an output terminal;
   a transistor comprising:
     a drain terminal coupled to the output terminal;
     a source terminal coupled to a ground rail; and
     a backgate terminal coupled to a ground via a resistor;
   wherein the resistor is configured to decouple the backgate terminal from the ground rail at frequencies higher than a selected frequency.

10. The output buffer circuit of claim 9, further comprising a clamp transistor coupled in parallel with the resistor, and configured to couple the backgate terminal to the ground rail.

11. The output buffer circuit of claim 9, wherein the resistor has a resistance of approximately 1 kiloohm.

12. The output buffer circuit of claim 9, wherein:
   the transistor is a first transistor;
   the resistor is a first resistor; and
   the output buffer circuit comprises:
     a second transistor comprising:
       a drain terminal coupled to a gate terminal of the first transistor via a second resistor; and
       a source terminal coupled to the ground rail.

13. The output buffer circuit of claim 12, wherein the second resistor has a resistance of approximately 10 kiloohms.

14. The output buffer circuit of claim 9, wherein:
   the resistor is a first resistor; and
   the output buffer circuit comprises:
     a second resistor comprising a first terminal coupled to a power supply rail;
     a diode comprising:
       an anode terminal coupled to the backgate terminal of the transistor; and
       a cathode terminal coupled to a second terminal of the second resistor.

15. The output buffer circuit of claim 14, further comprising a clamp transistor coupled in parallel with the second resistor.

16. The output buffer circuit of claim 14, wherein the second resistor has a resistance of approximately 10 kiloohms.

17. An integrated circuit, comprising:
   an output buffer circuit including:
     an output terminal;
     a first transistor comprising:
       a first terminal coupled to the output terminal;
       a second terminal connected to a ground rail; and
       a third terminal coupled to an output signal source;
     a first resistor comprising:
       a first terminal coupled to a fourth terminal of the first transistor; and
       a second terminal connected to the ground rail;
     a second resistor comprising a first terminal coupled to the third terminal of the first transistor;
     a second transistor comprising:
       a first terminal coupled to a second terminal of the second resistor; and
       a second terminal coupled to the ground rail;
     a third resistor comprising a first terminal coupled to a power supply rail; and
     a diode comprising:
       an anode terminal coupled to the fourth terminal of the first transistor; and a cathode terminal coupled to a second terminal of the second resistor.

18. The integrated circuit of claim 17, wherein the output buffer circuit further comprises:
a third transistor comprising:
a first terminal coupled to the power supply rail;
a second terminal coupled to the ground rail; and
a third terminal coupled to the cathode terminal of the diode.

19. The integrated circuit of claim 17, wherein:
the first resistor has a resistance of approximately 1 kiloohm; and
the second resistor has a resistance of approximately 10 kiloohms.

* * * * *